United States Patent [19]
Kamiyo et al.

[11] Patent Number: 4,636,536
[45] Date of Patent: Jan. 13, 1987

[54] ELECTROMAGNETIC INTERFERENCE-SHIELDING, FLAME-RETARDANT ABS RESIN COMPOSITION

[75] Inventors: Sumio Kamiyo, Toyohashi; Mitsuto Yoshihiro, Yokohama, both of Japan

[73] Assignee: Mitsubishi Rayon Co., Ltd., Tokyo, Japan

[21] Appl. No.: 776,803

[22] Filed: Sep. 17, 1985

[30] Foreign Application Priority Data

Sep. 20, 1984 [JP] Japan ................................. 59-197690

[51] Int. Cl.$^4$ ............................ C08K 7/00; C08K 3/08; G21F 1/10; G21K 1/10
[52] U.S. Cl. ..................................... 523/137; 252/513; 523/220; 523/440; 523/504
[58] Field of Search ................ 523/137, 220; 252/513; 524/440

[56] References Cited

U.S. PATENT DOCUMENTS

4,500,595 2/1985 Gerteisen et al. .................... 428/294
4,566,990 1/1986 Liu et al. ............................... 523/220

FOREIGN PATENT DOCUMENTS

58-150203 9/1983 Japan .
2112796 12/1982 United Kingdom .

*Primary Examiner*—Herbert J. Lilling
*Attorney, Agent, or Firm*—Oblon, Fisher, Spivak, McClelland & Maier

[57] ABSTRACT

An electromagnetic interference-shielding, flame-retardant ABS resin composition exhibiting high retentions of electromagnetic interference-shielding performance, which comprises a blend of a flame-retardant ABS resin (A) with 5 to 20% by weight of stainless steel fibers (B) having an average diameter of 3 to 50 $\mu$m and an average fiber length of 3 to 50 mm and with 4 to 30% by weight of glass fibers (C) having an aspect ratio of at least 50 and an average diameter of at least 5 $\mu$m, wherein the total amount of the components (A), (B), and (C) is 100% by weight.

6 Claims, 3 Drawing Figures

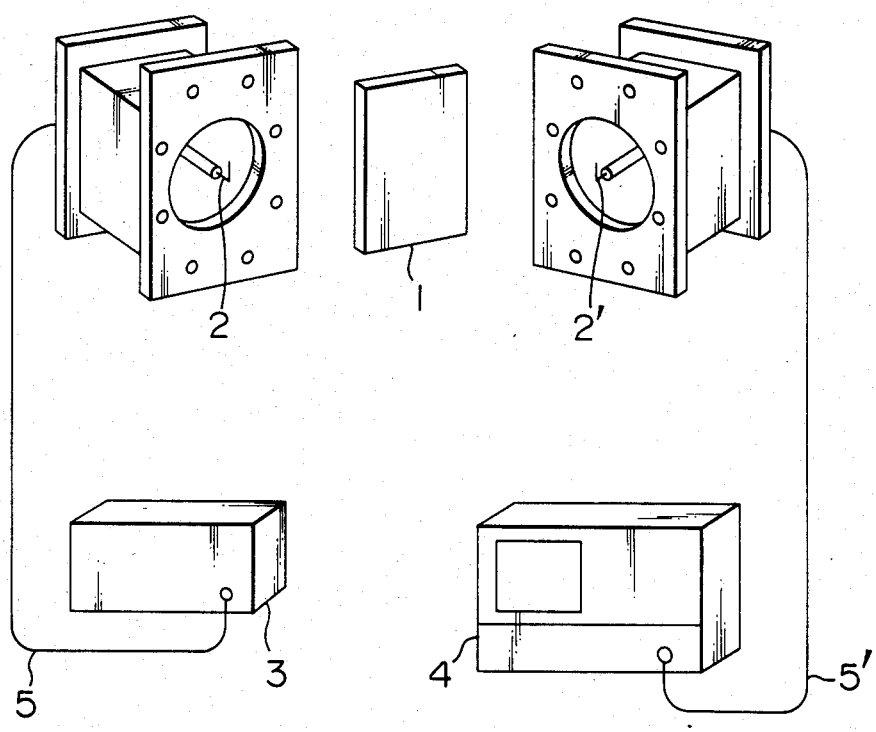
FIG.
(A)   (C)   (B)

ELECTROMAGNETIC INTERFERENCE-SHIELDING, FLAME-RETARDANT ABS RESIN COMPOSITION

BACKGROUND OF THE INVENTION

The present invention relates to an electromagnetic interference-shielding, flame-retardant ABS resin composition which has a high retention of electromagnetic interference-shielding performance even when the composition is exposed to such a high temperature atmosphere as 50° C. or higher or exposed to such an atmosphere that the temperature thereof is varied to cycle between 50° C. or higher and 0° C. or lower.

ABS resins are widely used in the so-called office automation field as materials for making electronic parts and housings. For these purposes, materials are required to have high degree flame retardance and flame-retardant ABS resins meeting the requirements of the UL standard 94 V-0 of U.S.A are used as a rule.

Additionally, it is indispensable to subject such electronic parts and housings to electromagnetic interference-shielding treatment as provided in the U.S. FCC regulation relating to the prevention of electromagnetic interference. It has been investigated as a method of the electromagnetic interference-shielding treatment that an electrically conductive filler such as metallic fibers, metallic foils, carbon fibers, or the like is blended into a resin or a special resin such as a flame-retardant ABS resin depending on the application purpose (e.g. Japanese Patent Application Laid-Open No. 150203/83 corresponding to GB 2112796A).

However, the blending of a conductive filler such as aluminum fibers, aluminum flakes, brass fibers and the like into a flame-retardant ABS resin has the drawback of deteriorating the flame-retardance though its cause is not clear, thus making it difficult to meet the requirements of the UL standard 94 V-0. In consequence, it is conceivable in this case to increase the mixing proportion of the flame retardant for the purpose of improving the deterioration of the flame retardance, but this method is not necessarily desirable since this will worsen physical properties and the appearance of the molded articles and increase the material cost.

On the other hand, it has been found that, although such a resin composition containing aluminum fibers or the like exhibits a high electromagnetic interference-shielding performance, this initial performance is markedly lowered when the composition is exposed, for instance, to a 50° C. or higher temperature atmosphere or to such an atmosphere that the temperature thereof is varied to cycle between 50° C. or higher and 0° C. or lower (i.e. thermal shocks are given).

Electromagnetic interference-shielding resins used for electronic parts and housings as stated above are considered to be exposed to such variation in temperature environments as above during transportation by ship or aircraft or during service under some conditions. Accordingly, there has been requested early development of such a flame-retardant ABS resin composition that the flame retardance thereof is not deteriorated and the electromagnetic interference-shielding performance thereof does not vary.

SUMMARY OF THE INVENTION

In view of the present situation stated above, the present inventors made intensive studies, and found that an electromagnetic interference-shielding, flame-retardant ABS resin composition which steadily retains an electromagnetic interference shielding performance while securing a high degree flame retardance can be obtained by blending a flame-retardant ABS resin which meets the requirements of the UL standard 94 V-0, with specific amounts of stainless steel fibers having specific dimensions and of glass fibers having specific dimensions. Based on this finding, the present invention has been accomplished.

The substance of the invention is an electromagnetic interference-shielding, flame-retardant ABS resin composition comprising a blend of a flame-retardant ABS resin (A) with 5 to 20% by weight of stainless steel fibers (B) having an average diameter of 3 to 50 82 m and an average fiber length of 3 to 50 mm and with 4 to 30% by weight of glass fibers (C) having an aspect ratio of at least 50 and an average diameter of at least 5 $\mu$m, wherein the total amount of the components (A), (B), and (C) is 100% by weight.

DETAILED DESCRIPTION OF THE INVENTION

The flame-retardant ABS resin in the present invention satisfies the requirements of the UL standard 94 V-0 of U.S.A. relating to incombustibility tests, that is, the resin has a flame retardance rated as V-0 according to the UL standard 94 when measured, for example, on test plates of about ⅛ inch in thickness.

The ABS resin is composed of (1) a graft copolymer of monomers including a vinyl cyanide compound such as acrylonitrile, an aromatic vinyl compound such as styrene or α-methylstyrene, maleic anhydride, and an aromatic maleimide on a backbone rubber consisting mainly of butadiene or (2) a mixture of said graft copolymer and copolymer comprising the above monomers used for grafting. The ABS resin includes general purpose grades and heat resistant grades.

For providing flame retardance, known flame retardants may be used including, for example, halogenated diphenyl ethers, polycarbonate oligomers of a halogenated bishpenol A type, tetrabromobisphenol A, halogenated polyethylenes, halogenated polystyrenes, brominated expoxy compounds and derivatives thereof, and inorganic or organic antimony compounds. These compounds can be used alone or in combination so as to satisfy the UL standard 94 V-0 requirements.

The stainless steel fibers (B) in the present invention have an average diameter of 3 to 50 $\mu$m, preferably 5 to 10 $\mu$m and an average fiber length of 3 to 50 mm, preferably 5 to 10 mm. The blending proportion of the stainless steel fibers (B) is from 5 to 20%, preferably from 5 to 10%, by weight in the total resin composition.

When aluminum fibers, aluminum flakes, or brass fibers are blended as an electrically conductive filler into a flame-retardant ABS resin, the flame retardance thereof is lowered. In contrast to this, the blending of a specific amount of the above defined stainless steel fibers having specific dimensions as in the present invention results in practically no loss of the flame retardance. Thus a sufficient electromagnetic interference-shielding performance can be afforded while maintaining the ratings of the UL standard 94 V-0. In addition, the blended stainless steel fibers (B) are resistant to flexural damage during processing of the resulting resin composition, and the composition is superior in the balance of physical properties, processability, and the appearance of molded articles.

The glass fibers (C) in the present invention have an aspect ratio of at least 50, preferably from 100 to 500, and an average diameter of at least 5 μm, preferably from 10 to 20 μm. The blending proportion of the glass fibers (C) is from 4 to 30%, preferably from 5 to 15%, by weight in the total resin composition.

In the present invention, the shape and size of the glass fibers (C) play an important role in retaining the electromagnetic interference-shielding performance; for instance, with glass fibers having an aspect ratio of less than 50, the retention of the electromagnetic interference-shielding performance tends to be lowered. Thus, glass fibers having a smaller aspect ratio are little effective in improving the retention of the electromagnetic interferance-shielding performance.

The blending proportion of the glass fibers (C) is also an important factor to the electromagnetic interference-shielding performance. As the blending proportion is increased, the initial performances of electromagnetic interference-shielding lowers and although the retention of the shielding performance rises, the absolute value of the performance lowers, and additionally physical properties and processability of the resulting composition are adversely affected. When the blending proportion is too small, the effect of improving the retention of the electromagnetic interference-shielding performance is not produced.

It is unprecedented, quite epoch-making matter that an electromagnetic interference-shielding, flame-retardant ABS resin composition which exhibits a high retention of the electromagnetic interference-shielding performance can be produced without practical loss of the flame retardance of the flame-retardant ABS resin by using stainless steel fibers (B) jointly with glass fibers (C) under specific conditions according to the present invention.

It is not clear why the resin composition of the invention comprising the above described construction exhibits a high retention of the electromagnetic interference-shielding performance even when the composition is exposed to such a high temperature atmosphere as 50° C. or higher or exposed to such an atmosphere that the temperature thereof is varied to cycle between 50° C. or higher and 0° C. or lower. However, this seems to result on the ground that the glass fibers act to hinder the thermal expansion or distortion of the flame-retardant ABS resin, which has a high thermal expansion coefficient as compared with the stainless steel fibers, thereby enabling the ABS resin to keep good contact with the stainless steel fibers. Such effect, being not found in the past, is very surprising.

The present invention is illustrated by the following examples. In the following examples and comparative examples, properties of resin compositions were measured and evaluated in the following ways:

Measurement of electromagnetic interference-shielding performance (referred to as EMIS hereafter):

EMIS was determined by the damption factor of field strength at an A.C. field frequency of 500 MHz using a shield box as shown in the accompanying drawing.

The drawing is a schematic exploded view of the whole assembly used for measuring the electromagnetic interference-shielding performance. In the drawing, (A) is a perspective view of an electromagnetic wave transmitter, (B) is a perspective view of an electromagnetic wave receiver, and (C) is a perspective view of a flat plate test specimen.
1—Flat plate test specimen
2—Antenna for electromagnetic wave transmission
2'—Antenna for electromagnetic wave receiving
3—Electromagnetic wave generator (tracking generator)
4—Device for analyzing the intensity of electromagnetic waves received (spectrum analyzer)
5,5'—Circuit Measurement of retention of EMIS The test specimen was left standing at −35° C. for 1 hour and then at 80° C. for 1 hour. The above procedure, as one cycle, was repeated 20 cycles, and thereafter the value of the EMIS was measured at 23° C. The retention was expressed by the ratio (%) of the above value to the initial value.

Measurement of spiral flow length

Using an injection molding machine (model SJ-40C supplied by Meiki Co., Ltd.), spiral flow lengths (cm) were measured in injection molding at an injection pressure of 750 Kg/cm$^2$, mold temperature of 60° C. (mold cavity width 15 mm, mold cavity thickness 2 mm), injection modling temperature of 240° C., and injection cycle of 60 seconds.

Measurement of Izod impact strength

The measurement was made in accordance with ASTM D256 using $\frac{1}{4}$-inch-notched test specimens.

Evaluation of appearance of molded article

Test specimens for measuring of the EMIS were used and the appearance thereof was rated by visual observation. The ratings were expressed as follows:
O—Good appearance
Δ—Fair appearance
X—Defective appearance Evaluation of flame retardance The evaluation was conducted in accordance with the UL standard 94 of U.S.A. using test specimens of $\frac{1}{8}$ inch in thickness.

EXAMPLES 1-5 AND COMPARATIVE EXAMPLES 1-10

"Diapet ABS VP-5" (tradename of a flame-retardant ABS resin, supplied by Mitsubishi Rayon Co., Ltd.) meeting the requirements of the UL standard 94 V-0, fibers of each of stainless steel, brass, and aluminum as conductive fibers, and glass fibers were mixed together in proportions as shown in Tables 1,2, and 3 by using a blender.

Each of the resulting blends was fed to a 45-mm φ melt extruder and melt-extruded under the conditions of screw compression ratio 2, screw revolution 30 r.p.m, and resin temperature 240° C. to form pellets.

Each of these groups of pellets was fed to an injection molding machine (model IS-50, supplied by Toshiba Machine Co., Ltd.) and molded under the conditions of back pressure 0, screw revolution 40 r.p.m., resin temperature 240° C., and low injection speed, giving flat plate test specimens (10 cm L×10 cm W, 3 mm thick) for measurement of the EMIS.

These test specimens were measured for the EMIS and the retention thereof.

Results thereof are shown in Tables 1-3.

Results of evaluating the apperance of these flat plate test specimens are also shown in Tables 1-3.

Further, groups of pellets prepared in the above manner were measured for spiral flow length, Izod impact strength, and flame retardance by the above described methods. Results thereof are also shown in Tables 1-3.

It may be noted that Table 1 shows effects of combinations of three kinds of conductive fibers with glass fibers, Table 2 shows effects of the blending proportion of stainless steel fibers, and Table 3 shows effects of the shape and blending proportion of glass fibers.

TABLE 1

| | Flame-retardant ABS Resin | | Conductive fibers | | | Glass fibers | | |
|---|---|---|---|---|---|---|---|---|
| | Tradename | Blending proportion (wt. %) | Type | Shape ($\mu\phi \times$ mm) | Blending proportion (wt. %) | Shape ($\mu\phi \times$ mm) | Aspect ratio | Blending proportion (wt. %) |
| Example 1 | Diapet ABSVP-5 | 84 | Stainless steel fibers | 6.5 × 6 | 8 | 13 × 3 | 231 | 8 |
| Comparative Example 1 | Diapet ABSVP-5 | 43 | Brass fibers | 30 × 1.6 | 47 | " | " | 10 |
| Comparative Example 2 | Diapet ABSVP-5 | 51 | Aluminum fibers | 70 × 1.8 | 39 | " | " | " |
| Comparative Example 3 | Diapet ABSVP-5 | 92 | Stainless steel fibers | 6.5 × 6 | 8 | — | — | — |
| Comparative Example 4 | Diapet ABSVP-5 | 53 | Brass fibers | 30 × 1.6 | 47 | — | — | — |
| Comparative Example 5 | Diapet ABSVP-5 | 61 | Aluminum fibers | 70 × 1.8 | 39 | — | — | — |

| | EMIS Initial value (dB) | EMIS Retention (%) | Spiral flow length (cm) | Izod impact strength (Kg · cm/cm) | Appearance of molded plate | Flame-retardance (UL Standard 94 burning rating) |
|---|---|---|---|---|---|---|
| Example 1 | 43 | 90 | 20 | 7 | | V-0 |
| Comparative Example 1 | 58 | 70 | 8 | 5 | X | HB[1] |
| Comparative Example 2 | 33 | 50 | 7 | 6 | " | V-2 |
| Comparative Example 3 | 43 | 65 | 24 | 8 | | V-0 |
| Comparative Example 4 | 59 | 30 | 10 | 5 | X | HB |
| Comparative Example 5 | 35 | 25 | 8 | 6 | " | V-2 |

[1]HB: Horizontal Burning

TABLE 2

| | Flame-retardant ABS resin | | Conductive fibers | | | Glass fibers | | |
|---|---|---|---|---|---|---|---|---|
| | Tradename | Blending proportion (wt. %) | Type | Shape ($\mu\phi \times$ mm) | Blending proportion (wt. %) | Shape ($\mu\phi \times$ mm) | Aspect ratio | Blending proportion (wt. %) |
| Comparative Example 6 | Diapet ABSVP-5 | 89 | Stainless steel fibers | 6.5 × 6 | 3 | 13 × 3 | 231 | 8 |
| Example 2 | Diapet ABSVP-5 | 84 | Stainless steel fibers | " | 8 | " | " | " |
| Example 3 | Diapet ABSVP-5 | 72 | Stainless steel fibers | " | 20 | " | " | " |
| Comparative Example 7 | Diapet ABSVP-5 | 67 | Stainless steel fibers | " | 25 | " | " | " |

| | EMIS Initial value (dB) | EMIS Retention (%) | Spiral flow length (cm) | Izod impact strength (Kg · cm/cm) | Appearance of molded plate | Flame-retardance (UL Standard 94 Burning rating) |
|---|---|---|---|---|---|---|
| Comparative Example 6 | 17 | 90 | 22 | 8 | | V-0 |
| Example 2 | 43 | " | 20 | 7 | " | " |
| Example 3 | 65 | 95 | 17 | 6 | " | " |
| Comparative Example 7 | " | 97 | 15 | 5 | Δ | V-1 |

TABLE 3

| | Flame-retardant ABS resin | | Conductive fibers | | | Glass fibers | | |
|---|---|---|---|---|---|---|---|---|
| | Tradename | Blending proportion (wt. %) | Type | Shape (μφ × mm) | Blending proportion (wt. %) | Shape (μφ × mm) | Aspect ratio | Blending proportion (wt. %) |
| Comparative Example 8 | Diapet ABSVP-5 | 90 | Stainless steel fibers | 6.5 × 6 | 8 | 13 × 3 | 231 | 2 |
| Example 4 | Diapet ABSVP-5 | 84 | Stainless steel fibers | " | " | " | " | 8 |
| Example 5 | Diapet ABSVP-5 | 72 | Stainless steel fibers | " | " | " | " | 20 |
| Comparative Example 9 | Diapet ABSVP-5 | 57 | Stainless steel fibers | " | " | " | " | 35 |
| Comparative Example 10 | Diapet ABSVP-5 | 84 | Stainless steel fibers | " | " | 10 × 0.15 | 15 | 8 |

| | EMIS | | Spiral flow length (cm) | Izod impact strength (Kg · cm/cm) | Appearance of molded plate | Flame-retardance (UL Standard 94 burning rating) |
|---|---|---|---|---|---|---|
| | Initial value (dB) | Retention (%) | | | | |
| Comparative Example 8 | 43 | 73 | 22 | 8 | | V-0 |
| Example 4 | " | 90 | 20 | " | " | " |
| Example 5 | 30 | 97 | 17 | 5 | " | " |
| Comparative Example 9 | 25 | 99 | 13 | 4 | X | V-1 |
| Comparative Example 10 | 43 | 68 | 21 | 5 | | V-0 |

Effect of the invention

Having the construction described above, the resin composition of the present invention maintains sufficient flame retardance, simultaneously exhibits a high retention of its initial electromagnetic interference-shielding performance even when the composition is exposed to such a high temperature atmosphere as 50° C. or higher or exposed to such an atmosphere that the temperature thereof is varied to cycle between 50° C. or higher and 0° C. or lower, and is excellent in physical properties, processability, and the appearance of molded articles, thus achieving superior industrial effects.

What is claimed is:

1. An electromagnetic interference-shielding, flame-retardant ABS resin composition comprising a blend of a flame-retardant ABS resin (A) with 5 to 20% by weight of stainless steel fibers (B) having an average diameter of 3 to 50 μm and an average fiber length of 3 to 50 mm and with 4 to 30% by weight of glass fibers (C) having an aspect ratio of at least 50 and an average diameter of at least 5 μm, wherein the total amount of the components (A), (B), and (C) is 100% by weight.

2. The electromagnetic interference-shielding, flame-retardant ABS resin composition of claim 1, wherein the stainless steel fibers have an average diameter of 5 to 10 μm and an average fiber length of 5 to 10 mm.

3. The electromagnetic interference-shielding, flame-retardant ABS resin composition of claim 1 or 2, wherein the blending proportion of the stainless steel fibers is from 5 to 10% by weight in the total resin composition.

4. The electromagnetic interference-shielding, flame-retardant ABS resin composition of claim 1, wherein the glass fibers have an aspect ratio of 100 to 500 and an average diameter of 10 to 20 μm.

5. The electro magnetic interference-shielding, flame-retardant ABS resin composition of claim 1 or 4, wherein the blending proportion of the glass fibers is from 5 to 15% by weight in the total resin composition.

6. The electromagnetic interference-shielding, flame-retardant ABS resin composition of claim 1, wherein the stainless steel fibers have an average diameter of 5 to 10 μm and an average fiber length of 5 to 10 mm and the blending proportion of the stainless steel fibers is from 5 to 10% by weight in the total resin composition, and wherein the glass fibers have an aspect ratio of 100 to 500 and an average diameter of 10 to 20 μm and the blending proportion of the glass fibers if from 5 to 15% by weight in the total resin composition.

* * * * *